United States Patent [19]
Hornak

[11] 3,971,015
[45] July 20, 1976

[54] RECIRCULATING TYPE ANALOG TO DIGITAL CONVERTER

[75] Inventor: Thomas Hornak, Los Altos, Calif.

[73] Assignee: Hewlett-Packard Company, Palo Alto, Calif.

[22] Filed: Feb. 10, 1975

[21] Appl. No.: 548,315

[52] U.S. Cl. .................... 340/347 AD; 340/347 M; 340/347 CC
[51] Int. Cl.² ........................ H03K 13/02; 324 99 D
[58] Field of Search .............. 340/347 AD, 347 CC, 340/347 M

[56] References Cited
UNITED STATES PATENTS

| | | | |
|---|---|---|---|
| 3,049,701 | 8/1962 | Amdahl | 340/347 AD |
| 3,283,320 | 11/1966 | Blachowicz | 340/347 AD |
| 3,588,881 | 6/1971 | Gordon | 340/347 AD |

OTHER PUBLICATIONS

Schulz "IBM Technical Disclosure Bulletin", vol. 9, No. 6, Nov. 1966, pp. 616–618.

Primary Examiner—Charles D. Miller
Attorney, Agent, or Firm—Theodore Scott Park

[57] ABSTRACT

An analog to digital converter includes a comparator coupled to a cascade having in serial connection an analog switch, a time delay and an algorithmic coder. The algorithmic coder generates a signal at a first output which is an inverse of a signal appearing at the time delay input and a second output which is a selected function of a signal appearing at the time delay input corresponding to a desired conversion. An analog signal to be converted is applied to the time delay input and the first and second algorithmic coder outputs are sequentially passed through the cascade.

27 Claims, 10 Drawing Figures

3,971,015

RECIRCULATING TYPE ANALOG TO DIGITAL CONVERTER

BACKGROUND OF THE INVENTION

An analog to digital converter is a device which expresses the ratio of an analog input voltage to a reference voltage as a digital number. There are many known principles of analog to digital conversion as discussed, for example, in an Electronic Design Practical Guide to Analog to Digital Conversion, parts 1, 2 and 3 by H. Schmid in ELECTRONIC DESIGN, Dec. 5 and 19, 1968 and Jan. 4, 1969. The accuracy and resolution of these converters and systems in general are typically adversely affected by signals experiencing a DC shift when passing through a chain of circuit blocks.

The accuracy and resolution of converters are typically adversely affected by deviations of resistance ratios. Problems associated with converters having operational amplifiers include open loop gain deviation from prescribed values, input voltage and input current offsets, and finite input impedance. The speed of conversion is also limited by the slew rate of operational amplifiers. When using a transformer in the implementation of a converter, difficulties in preventing a D.C. voltage component from occurring across the transformer primary and eliminating offset and gain errors in the rest of the circuitry are experienced. Measurement of D.C. or slowly varying analog signals are impractical with prior transformer implementation.

Gain stabilization for a cascade composed of serially connected circuit blocks is generally achieved by ensuring a specified gain for each separate block. Local negative feedback with high loop gain in each block requires frequency compensation to ensure stability. This frequency compensation limits a converter's speed of conversion.

SUMMARY OF THE INVENTION

An analog to digital converter having a cascade including a time delay eliminates zero offset in the cascade by feeding back the cascade output to the cascade input via an offset-free feedback path and passing the signal a second time through the cascade within a time interval selected to ensure that the cascade's zero offset does not vary significantly between the first and second passage of the signal and having a cascade gain and a feedback path transfer ratio whose product is equal to $-1$.

Cascade gain is stabilized and conversion speed improved by implementing the cascade with a gain control and circuits each having low gain in its local feedback loop thereby requiring minimal frequency compensation. The gain of the gain control is automatically adjusted by a control voltage in a repetitive calibration cycle.

Critical resistance ratios required in the prior art for implementing algorithms requiring polarity inversion, voltage doubling or summing when coding direct current or slowly varying analog signals is eliminated by utilizing a transformer having a plurality of secondary windings to implement the algorithm, inserting capacitance in series with the primary winding of the transformer and eliminating zero offset as described hereinabove.

DESCRIPTION OF THE PREFERRED EMBODIMENT

Figure 1:
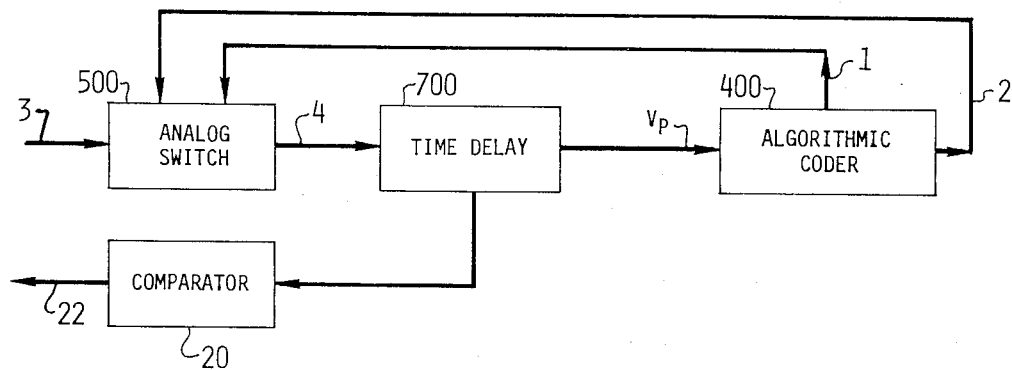
FIG. 1 is a block diagram of an analog to digital converter made in accordance with the invention.

Referring to FIG. 1, an analog to digital converter is shown. A voltage comparator 20 is coupled to a time delay having a time delay of $\tau$. The time delay 700 is connected in cascade with an analog switch 500 and an algorithmic coder 400. The algorithmic coder 400 generates a signal at output 2 which is a selected function of its input signal $V_P$, the function corresponding to a desired coding, and a first output which is an inverse of a signal appearing at input 4 of time delay 700. The second output 2 and the first output 1 are sequentially passed a plurality of times through the cascade by means of analog switch 500.

Figure 2:
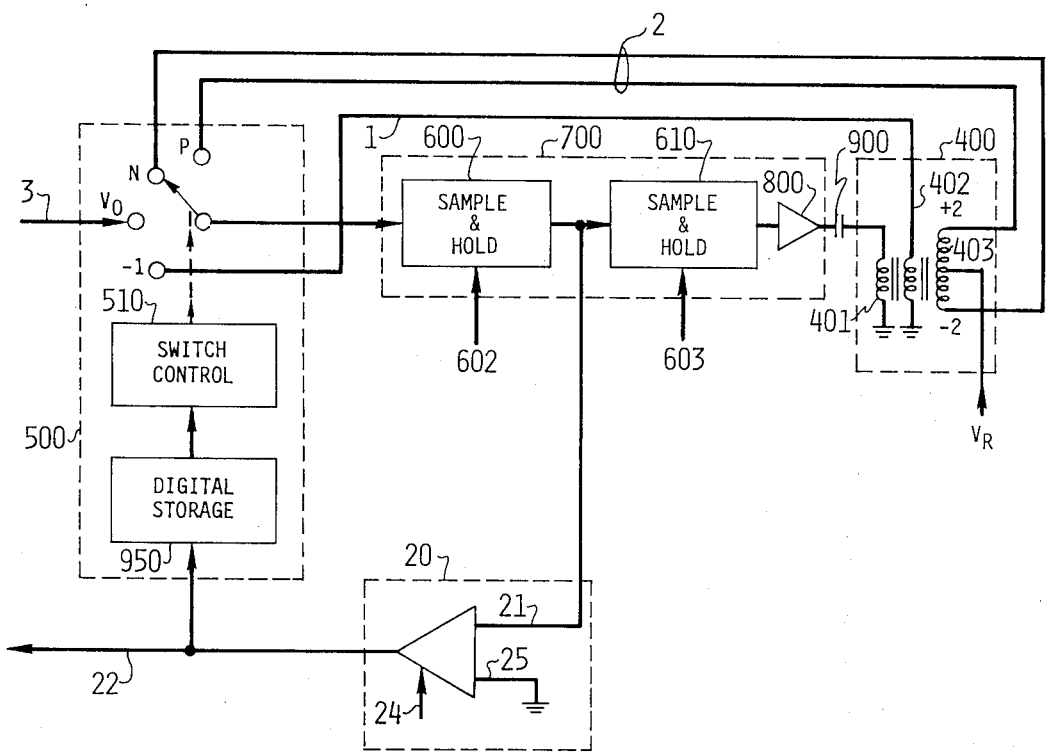
FIG. 2 shows a preferred embodiment of a Gray code converter utilizing a transformer as an algorithmic coder.

Referring to FIG. 2 a Gray code converter utilizing a transformer as the algorithmic coder 400 is shown. Analog switch 500 is in position $V_0$ at the start of analog to digital conversion. A voltage comparator 20 coupled to time delay 700 senses the polarity of a signal applied to time delay 700. Voltage comparator 20 produces a first logic signal when its input is above a zero voltage and a second logic signal when its input is below a zero voltage thereby producing a digital output 22. The digital output 22 is applied to analog switch 500.

Time delay 700 comprises sample and hold circuits 600 and 610 and a driver 800. Sample and hold circuits 600 and 610 are controlled by control pulses 602 and 603 in a two phase mode to propagate the signal through the time delay 700. The output of time delay 700 is applied to a capacitor 900 to become the primary voltage of a transformer 400 having a primary winding 401, an auxiliary secondary winding 402 and a center tapped secondary winding 403 having a transformation ratio of 4 and a positive $+2$ and a negative $-2$ end.

The voltage across the primary is $V_{P1} = V_0 + V_{off}$ for unity gain and a voltage difference $V_{off}$ between the input of sample and hold circuit 600 and the primary winding of transformer 400. The auxiliary secondary winding 402 has a transformation rato of − 1 and the voltage across this winding is $-V_{P1} = -V_0 - V_{off}$.

Referring to FIG. 2, switch 500 goes into position −1 and $-V_{P1}$ propagates through time delay 700 and capacitance 900. Assuming that $V_{off}$ did not change from the previous value, the new voltage across the primary winding of transformer 400 is $V_{P2} = -V_{P1} + V_{off}$ which equals $-V_0 - V_{off} + V_{off} = -V_0$. The offset voltage $V_{off}$ is thereby cancelled.

For a voltage across the primary winding of transformer 400 equal to $-V_0$ the voltage at the positive end of the secondary winding 403 is $V_R - 2V_0$ and at the −2 end is $V_R + 2V_0$, $V_R$ being a reference voltage connected to the center tap of winding 403. In response to a previously sensed positive polarity $V_0$ stored in digital storage 950 switch control 510 causes switch 500 to go into position P thereby applying to comparator 20 and analog storage 700 a voltage $V_1$ which equals $V_R - 2V_0$. For a previously sensed and stored negative polarity $V_0$ switch control 510 causes switch 500 to go into position N. The voltage fed into analog storage 700 and the comparator 20 is then $V_1 = V_R + 2V_0$. The net result of the described operation is $V_1 = V_R - 2|V_0|$, an algorithm representing a Gray code conversion.

Referring again to FIG. 2, comparator 20 senses the polarity of voltage $V_1$ and the polarity is stored in storage 950. Voltage $V_1$ propagates through the time delay 700 and condenser 900. Switch 500 goes again into position "−1" and then to position P or N in response to switch control 510 according to the polarity of $V_1$ stored by storage 950. This is repeated n times, n being the required number of bits. To initiate a new conversion, switch 500 goes into switch position "$V_0$" thereby taking a new sample of an applied input voltage $V_0$. The sequence of polarities sensed by the comparator of FIG. 2 represents a serial Gray Code expression of the ratio $V_0/V_R$. The Gray code can be easily converted to a binary code in any well known manner.

The circuit shown in FIG. 2 is insensitive to input-output voltage offsets in the two sample and hold circuits 600, 610 and in the transformer driver 800, as long as these offsets change only negligibly within the delay of time delay 700. This simplifies the circuit design considerably, because problems of thermal drifts and component matching are eliminated. The capacitance 900 isolates the transformer primary 401 from any D.C. voltage components and enables the converter to be useful for converting slowly varying or D.C. analog signals.

To preserve the compensation of $V_{off}$, the voltage across capacitance 900 changes within the time delay of time delay 700 only negligibly. This is ensured by selection of a minimum value of capacitor 900 and of the transformer primary 401 inductance.

Figures 3, 9:
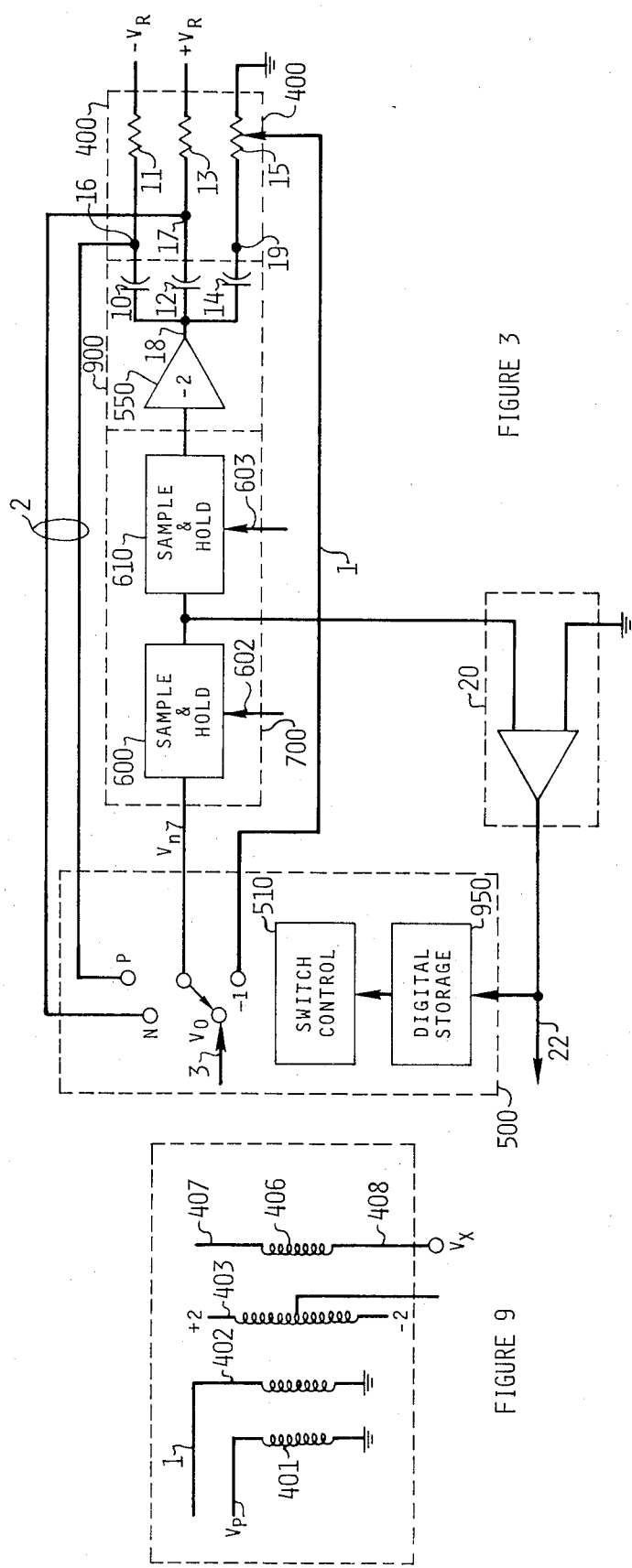
FIG. 3 shows a preferred embodiment of a converter producing a weighted binary code utilizing precision resistances to form an algorithmic coder.
FIG. 9 shows a preferred embodiment of an algorithmic coder utilizing a transformer and having a third secondary winding.

Referring to FIG. 3, there is shown a converter producing a weighted binary code and utilizing precision resistances to implement coder 400. Analog switch 500 is similar to that of the analog switch 500 of the embodiment shown in FIG. 2. An amplifier 550 having a gain of −2 is coupled to time delay 700 and applies its output to algorithmic coder 400. Analog switch 500 is in position $V_0$ at the start of the conversion. The voltage $V_0$ of an applied signal is sampled by switch 500 and propagated through time delay 700 in response to control pulses 602 and 603 to capacitance 900. A voltage $V_{18}$ is produced at node 18. Capacitance 900 is a capacitance network consisting of capacitors 10, 12 and 14, each of which is coupled to the output of time delay 700 at node 18. Algorithmic coder 400 comprises resistor 11 coupled to capacitor 10 at node 16 and to a reference voltage $-V_R$, resistor 13 coupled at node 17 to capacitor 12 and to a reference voltage $+V_R$, and resistor 15 coupled to capacitor 14 and to ground. Resistor 14 is center tapped and the center tap is connected to position −1 of switch 500. Node 16 is coupled to position P of switch 500 and node 17 is coupled to position N of switch 500.

The voltage propagated to the output of capacitance 900 at node 19 for a time delay input signal $V_n$ is $V_{19} = -2V_n + \Delta V_{19}$, $\Delta V_{19}$ being the voltage present at the output of capacitance 900 at node 19 for $V_n$ being zero. The voltage at the center tap of resistor 15 and at terminal −1 of switch 500 is $\frac{1}{2}V_{19} = -V_n + \frac{1}{2}\Delta V_{19}$.

Switch 500 switches to position −1 and transfers the voltage $-V_n + \frac{1}{2}\Delta V_{19}$ by means of time delay 700 and capacitance 900 to coder 400. The voltage at node 16 is $V_{16} = -V_R - 2(-V_n + \frac{1}{2}\Delta V_{19}) + \Delta V_{16} = 2V_n - V_R + \Delta V_{16} - \Delta V_{19}$, $-V_R + \Delta V_{16}$ being the voltage at node 16 corresponding to $V_n = 0$. The voltage at node 17 is $V_{17} = V_R - 2(-V_n + \frac{1}{2}\Delta V_{19}) + \Delta V_{17} = 2V_n + V_R - \Delta V_{19} + \Delta V_{17}$, $V_R + \Delta V_{17}$ being the voltage at node 17 for $V_n = 0$. The voltages $\Delta V_{16}$, $\Delta V_{17}$, and $\Delta V_{19}$ may be due to, for example, AC error signals existing at the output of amplifier 550. DC offsets existing in the sample and hold circuits 600, 610 and amplifier 550 are isolated from nodes 16, 17 and 19 by capacitors 10, 12 and 14.

Resistors 11, 13, 15 and capacitors 10, 12, 14 are selected to ensure that $(C_{10})(R_{11}) \approx (C_{12})(R_{13}) \approx (C_{14})(R_{15}) >>$ time delay of time delay 700 thereby providing $\Delta V_{16} = \Delta V_{17} = \Delta V_{19}$ and therefore $V_{16} = 2V_n - V_R$ and $V_{17} = 2V_n + V_R$. The influence of errors $\Delta V_{16}$, $\Delta V_{17}$ and $\Delta V_{19}$ is thereby eliminated.

Figure 4:
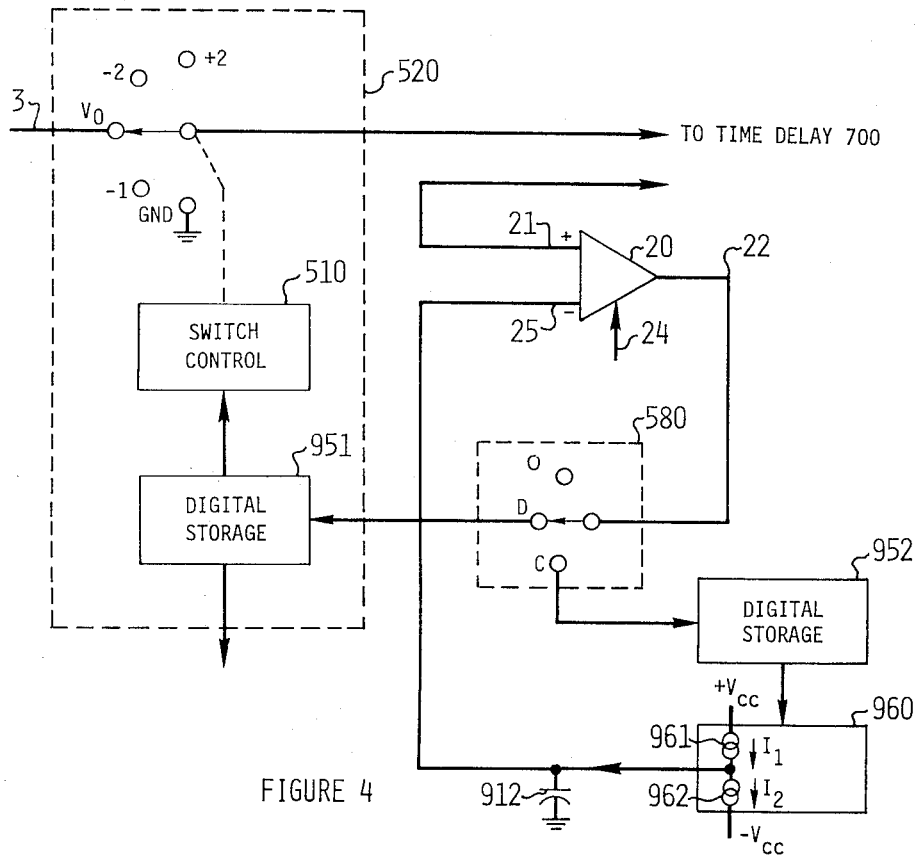
FIG. 4 represents a preferred embodiment of the invention wherein comparator offset errors are compensated in a converter made in accordance with this invention.

Referring to FIG. 4, a block diagram of a circuit compensating the offset of the comparator 20 is shown. An analog switch 520, the voltage comparator 20 and digital storage 951 correspond to the similar blocks in FIG. 3. In FIG. 4 analog switch 520 has one more position, GND, connected to a reference ground potential. A digital multiplexer 580 is inserted between the output of the comparator 20 and the input of digital storage 951, which was not shown in FIG. 3. During the previously described operation of the embodiment shown in FIG. 3, switch 520 was never in position GND and 580 was always in position D. After every complete conversion, or after every, two, three, or more complete conversions, switch 520 goes into positon GND, and, at the same time, 580 goes into position C. Assuming that switch 520 is without any offset, a zero voltage appears on the signal input of time delay 700.

Assume that, because of an offset a zero input voltage is sensed as being positive and, that a logic 1 appears at the comparator output 22. Multiplexer 580 being in position C, this logic 1 is stored in a digital storage 952.

Figure 5:
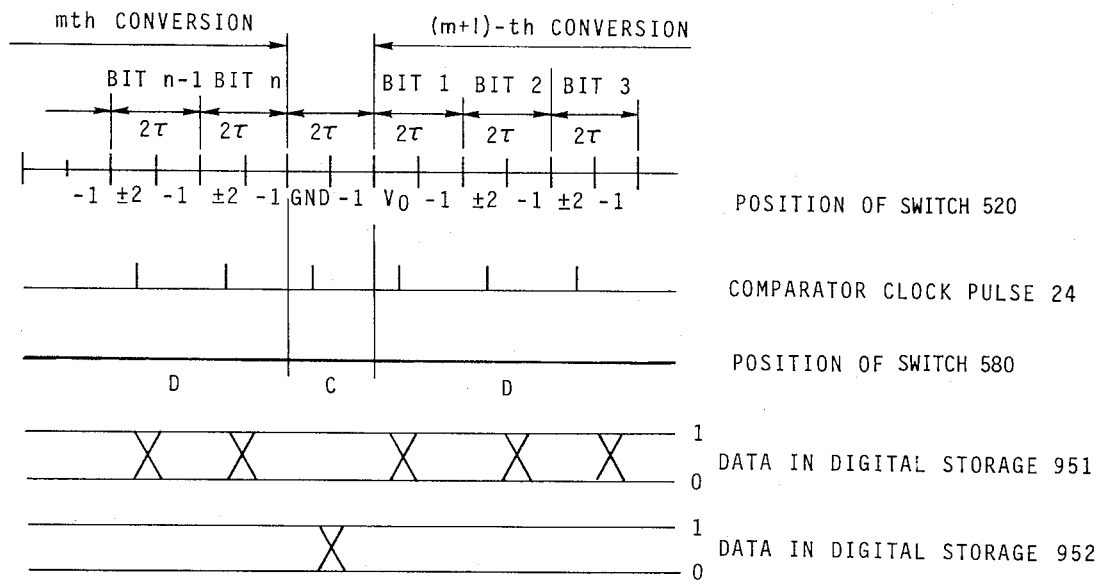
FIG. 5 displays the internal sequential timing relationships of the embodiment of FIG. 4.

Referring to FIG. 5, switch 520 goes into position "−1" and then into positon "$V_0$", to take a new sample of the input voltage and to start a new conversion. Multiplexer 580 returns to position D and the next conversion proceeds as described previously. Referring to FIG. 4, the output of digital storage 952 controls a current source 961 and a current sink 962 in a complementary mode. With logic 1 in storage 952, a current I1 is on and a current I2 is off. With a logic 0 in storage 952 the opposite is true. Currents I1 and I2 are approximately equal. The values of capacitor 912 and I1 and I2 are selected to ensure that during the time interval between two successive excursions of switch 520 to the position GND, the voltage across capacitor 912 changes less than the resolution of the converter.

In response to the previously assumed storage of a logic 1 in digital storage 952, current I1 flows into capacitor 912, increasing the voltage across it. After a number of repeated excursions of switch 520 to the positon GND and of 580 to the position C, the voltage across capacitor 912 and also at the reference input 25 of the comparator 20 rises to the point where the voltage comparator 20 senses the zero input voltage as being negative. A logic zero will then appear on the output 22 of the comparator 20 and in digital store 952. Current I1 stops and current I2 starts thereby decreasing the voltage across capacitor 912, until again a digital 1 appears in digital store 912. The sequence of logic 1's and 0's in digital store 2 adjusts the voltage across capacitor 912 thereby cancelling offset voltage. The occurrence ratio of the 1's and 0's in digital storage 952 depends only on the ratio I1/I2 as modified by the bias current of the comparator reference input 25.

Referring to FIG. 5, an offset voltage affecting a comparison is compensated at the expense of a slight decrease in conversion rate due to time required for switch 510 to sample ground. Because of the low rate of change of the voltage across capacitor 912, the circuit in FIG. 4 tracks only changes in offset voltage limited to about the rate: $V/2^n \cdot n\tau$, $n$ being an integer corresponding to the number of bits in a desired conversion and $\tau$ being the delay of time delay 700 (i.e. conversion resolution over conversion time). This rate is sufficient to follow changes caused by fluctuations in ambient temperature.

The offset voltage of a comparator typically varies by an input voltage-dependent power dissipation in its critical components. The magnitude and speed of these variations are difficult to predict. To minimize the probability of these effects, the comparator's critical components are stressed symmetrically. This is achieved by balancing the number of positive and negative decisions in the comparator as shown in FIG. 6.

Referring again to FIG. 4, there is shown a third position of digital multiplexer 580. In this position, 0, the digital output 22 of the comparator 20 is not used and the states of digital storage 1 and 2 remain uninfluenced. Assume the clock pulse frequency of the comparator is doubled.

Figure 6:
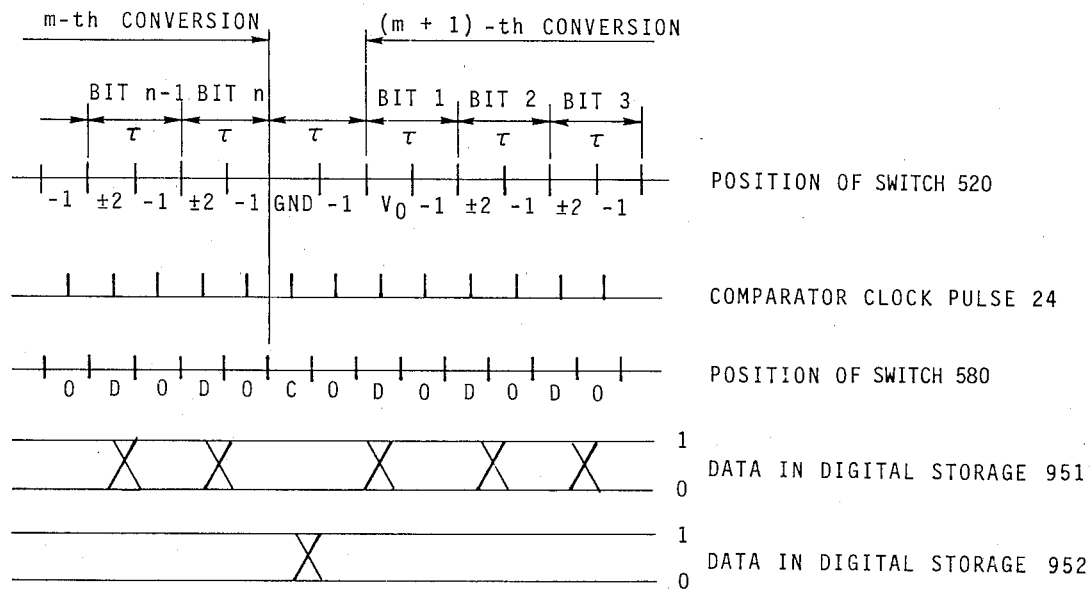
FIG. 6 displays the internal sequential timing relationships of the embodiment of FIG. 4 wherein the comparator is symmetrically electrically stressed.

Referring to FIG. 6, the clock frequency of the comparator is doubled and the comparator is clocked as in FIG. 5 and also when switch 520 is in position −1. The comparator senses a voltage of one polarity and subsequently senses a voltage of an opposite polarity thereby balancing the number of positive and negative decisions in the comparator.

Figure 7:
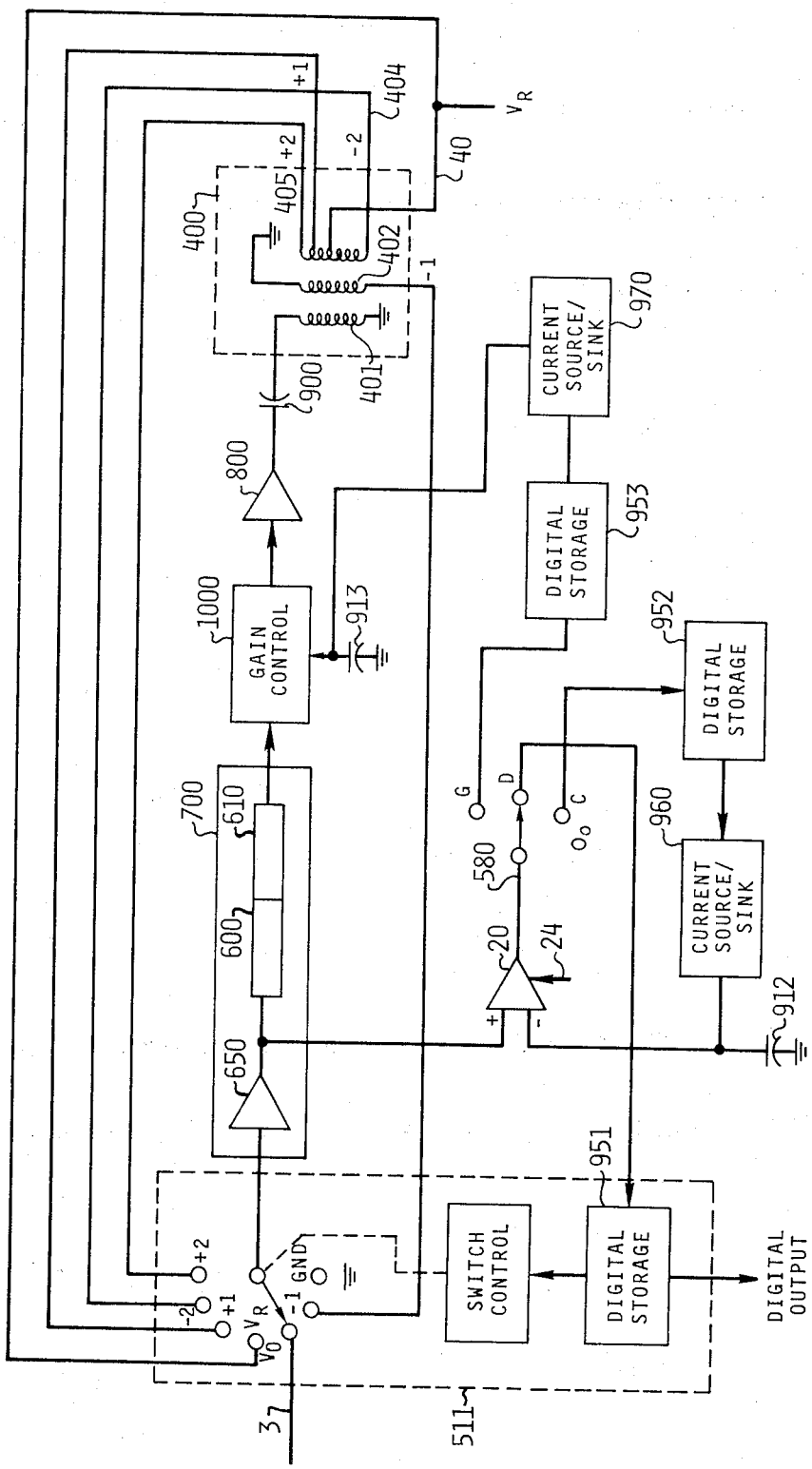
FIG. 7 represents a converter made in accordance with the invention employing comparator-offset compensation, cascade offset compensation, and gain correction.

In the previously described converter having comparator-offset compensation as well as in the earlier described cascade-offset compensation the analog switch 500 was driving the sample and hold 600 directly. Referring to FIG. 7, a buffer 650 is included within the time delay 700 to provide a desirable high input impedance for switch 511. Buffer 605 does not disturb the compensation mechanism and any input-output offset due to this isolating buffer is compensated in the same manner as described hereinabove.

Referring to FIG. 7, transformer 400 provides necessary voltage multiplication and voltage summing and a feedback transformation ratio of −1. To ensure that the product of the cascade gain and the feedback transfer ratio is −1, a cascade gain of +1 is required. The usual way to achieve a desired cascade gain is to implement each block in the cascade as a multistage high-gain feedback amplifier, each having a sufficiently exact gain, as for example, a voltage follower operational amplifier. The disadvantage of such an arrangement, however, is the large number of frequency compensating capacitors required which is an arrangement not suitable for integration techniques.

A preferred way is to build each block in the cascade of medium-gain single stage feedback amplifiers, as for example essentially current-source loaded emitter followers requiring no frequency compensating capacitors or the like, and to achieve a selected cascade gain by an additional gain correcting block. A system which stabilizes the cascade gain automatically is shown in FIG. 7.

Referring to FIG. 7, switch 511 has two more positions, one of them connected to the reference voltage $V_R$, the other to an additional tap on the main secondary winding of transformer 400. The transformation ratio of this tap is +1.

Figure 8:
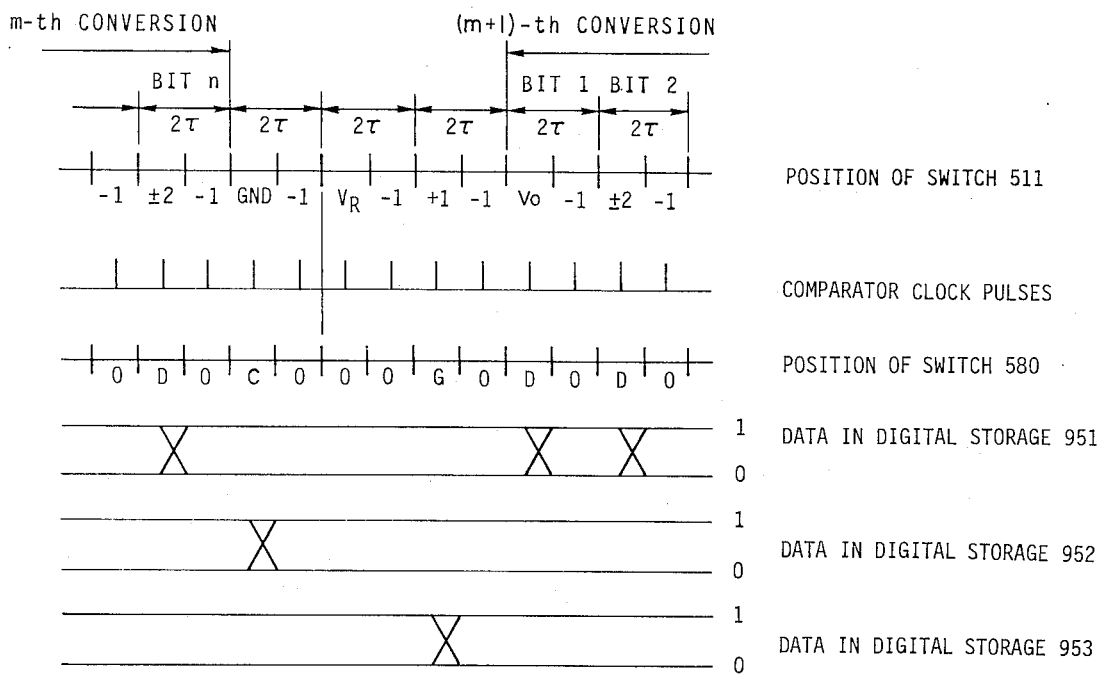
FIG. 8 displays the internal sequential timing relationships of the embodiment of FIG. 7.

Referring to FIGS. 7 and 8, switch 511 goes into position "$V_R$" and subsequently into position "−1". A voltage $-V_R$ appears across the transformer primary 401 and a zero voltage appears on tap "+1" if the cascade gain is correct. Assuming $V_R > 0$, for insufficient gain the voltage on tap "+1" is positive, with excess gain the voltage is negative.

Referring to FIG. 8, switch 511 goes into position "+1" and the polarity of the voltage on tap "+1" is sensed by the voltage comparator 20.

Referring to FIG. 7, digital multiplexer 580 has, in addition to the previously discussed positions C, D, and O, one more position G. With 580 in position G simultaneously with switch 511 in position "+1", the polarity of the voltage on tap "+1" is stored in digital storage 953, which drives current source/sink 970 in a manner similar to the current source/sink 960 driven by digital storage 952 in FIG. 4. Curent source/sink 970 feeds capacitor 913 with currents which adjust the voltage across capacitor 913. The voltage across capacitor 913 controls the gain of a gain control circuit 1000. Switch 511 returns to position "$V_R$" and "+1" once after every complete conversion (or every two, three or more complete conversions). A negligible voltage is maintained on tap +1 whenever switch 511 is in position +1 thereby automatically maintaining the correct cascade gain. Although the rate of change of the voltage across capacitor 913 is limited, it is sufficient to follow any changes in cascade gain caused by fluctuations in ambient temperature.

Figure 10:
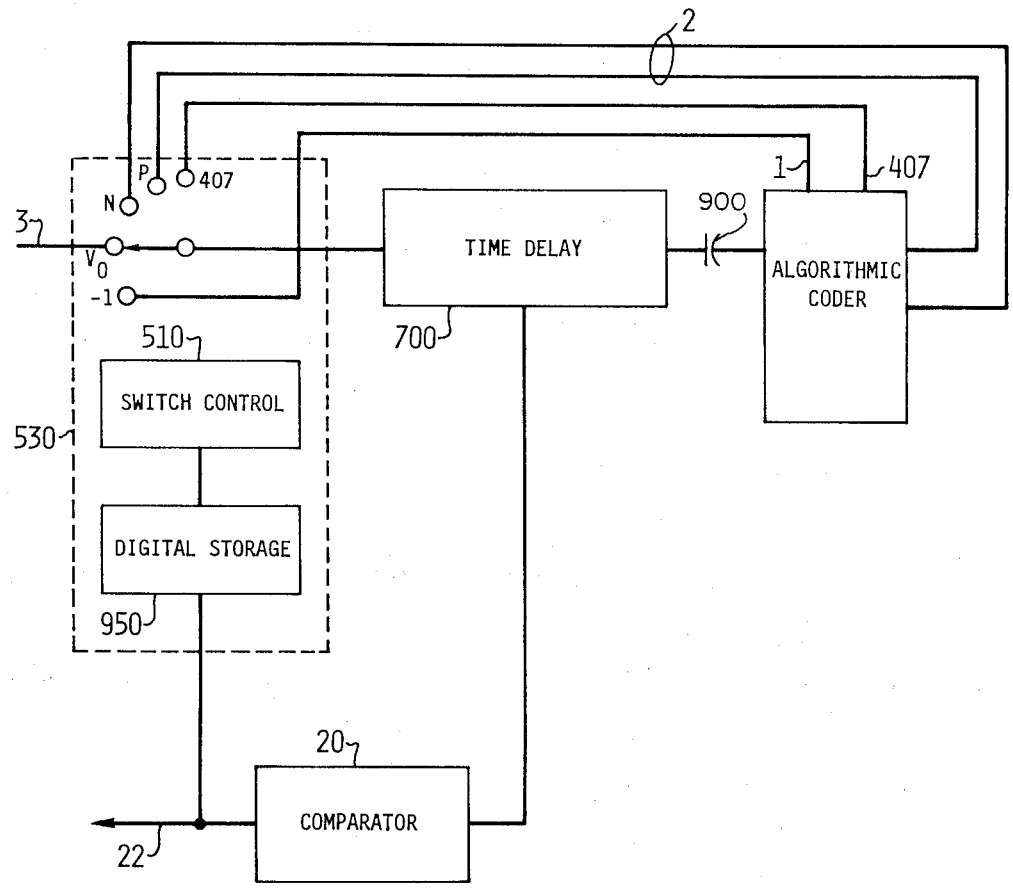
FIG. 10 is a block diagram of a converter having the algorithmic coder of FIG. 9.

Referring to FIG. 9, there is shown an algorithmic coder 400 similar to that depicted in FIG. 2 but having a third secondary winding 406 having a transformation ratio to the primary of a ratio (−A). Assume the algorithmic coder 400 of FIG. 9 is substituted in the converter circuit of FIG. 2 as shown in FIG. 10. As described before with respect to the converter of FIG. 2, switch 530 goes into position $V_0$ and samples applied analog signal 3 having a voltage $V_0$. Voltage $V_0$ propagates through time delay 700 and capacitor 900 into algorithmic coder 40. Switch 530 goes into position −1 and a signal which is essentially an inverse of $V_0$ is propagated through time delay 700 and capacitor 900. At the input to coder 400, the voltage $V_{P2}$ appearing after this second pass is exactly equal to $-V_0$. Now instead of switch 530 going into positions P or N as described hereinbefore the switch goes into a new position shown as 407 in FIG. 10, connected to end 407 of the third secondary 406 shown in FIG. 9. End 408 is connected to a signal having a voltage $V_x$. The voltage appearing at end 407 is $V_{407} = V_x - AV_{P2} = V_x + AV_0$. Voltage 407 is sampled by modified switch 530 and propagated twice through time delay 700 resulting in a $V_{P4} = -(V_x + AV_0)$, $V_{P4}$ indicating four passes through the cascade. The converter goes on to a new conversion as described with respect to FIG. 2, i.e. switch 530 goes to P or N depending on the polarity of $V_{407}$ sensed by comparator 20 and produces a digital code representing the voltage $V_{407}$ $V_x + AV_0$ instead of $V_0$ as in the embodiment of FIG. 2.

Referring to FIG. 10, input switch 530 includes an additional sampling terminal coupled to end 407 as described immediately above. Switch 500 samples the voltage appearing at end 407 twice before going to a conversion thereby sampling a voltage $V_{x2} + A(V_{x1} + AV_0) = V_{x2} + AV_{x1} + A^2V_0$. This voltage is then converted to a digital code corresponding to a selected conversion, for example, a Gray code, or the like.

The number of times switch 530 resamples end 407 before a conversion is completed is determined in advance and designed in the logic circuitry of switch control 510. Alternatively, the decision is derived from the digital output of comparator 20 as described hereinafter.

Assuming that $V_x$ is selected to be zero as in the case where end 408 is grounded, voltage 407 is equal to $A^mV_0$ where m is the number of times switch 530 samples end 407 before starting a new conversion. This is useful for example in modifying the sensitivity of the converter.

Assuming that $V_x$ is a second input voltage $V_0^1$ and $m = 1$, $V_{407}$ will equal $V_0^1 + AV_0$. For $A = -1$, $V_{407} = V_0^1 - V_0$ and the digital code represents the difference between two input voltages $V_0^1$ and $V_0$, each sample taken at a different time. $V_0$ and $V_0^1$ can be supplied by two separate signal sources or by the same signal source. In the latter case the converter output represents the difference between two instantaneous values of the same time dependent signal as, for example a pulse base voltage level versus a pulse peak voltage level.

$V_{407}$ equals $(1 + m)\overline{V_0}$ where $\overline{V_0}$ is the average voltage value of $V_0$ over $m$ samplings if $V_x$ is taken from the same source as $V_0$ and $A = 1$. This is useful to integrate before the start of a conversion $m$ samples of input signal $V_0$ in order to average out noise superimposed on $V_0$ or to increase a converter's sensitivity. If $m$ is automatically increased until the voltage $V_{407}$ reaches a level comparable with a converter's range, for example $\pm V_R$ in FIG. 2, a converter having automatic sensitivity control is implemented.

Increasing m in steps such that $m = 2^P$ where $P = 0, 1, 2, 3 \ldots N$ modifies the output code to reflect varying sensitivity and corresponds to a shifting of a "binary floating point" equivalent of a floating decimal point by P digits to left. A floating point analog to digital converter is thereby provided.

I claim:

1. An analog to digital converter comprising:
   a time delay having an input and an output;
   algorithmic means having an input for generating a first and second signal, the first signal being an inverse of a signal appearing at the time delay input and the second signal being a selected function of the time delay input signal corresponding to a desired conversion of an applied analog signal;
   switch means for coupling the time delay input to receive the applied analog signal and for repetitively coupling the time delay input to receive the first and second signals;
   means for coupling the time delay output to the algorithmic means input; and
   comparator means coupled to the time delay for producing a digital output signal.

2. An analog to digital converter as in claim 1 wherein means for coupling comprises a capacitor.

3. An analog to digital converter as in claim 2 wherein algorithmic means comprises a transformer having:
   a primary winding coupled to receive an input;
   an auxiliary secondary winding for producing the first signal; and
   a center tapped secondary winding having positive and negative ends for producing the second signal and a center tap for receiving a reference voltage.

4. An analog to digital converter as in claim 3 wherein the auxiliary secondary winding has a transformation ratio of $-1$.

5. An analog to digital converter as in claim 3 wherein the center tapped secondary winding has a transformation ratio of 4.

6. An analog to digital converter as in claim 1 wherein algorithmic means comprise:
   coupling means for coupling to a reference voltage source;
   a first resistor coupled to the coupling means and the means for coupling the time delay output to the algorithmic means input;
   a second resistor coupled to the coupling means and the time delay output;
   a third resistor coupled to the means for coupling the time delay output to the algorithmic means input and ground and having a tap for producing the first signal; and
   means for coupling to the first resistor and to the second resistor for producing the second signal.

7. An analog to digital converter comprising:
   a time delay having an input and an output;
   algorithmic means having an input for generating a first and second signal, the first signal being an inverse of a signal appearing at the time delay input and the second signal being a selected function of the time delay input signal corresponding to a desired conversion of an applied analog signal;
   switch means for coupling the time delay input to receive the applied analog signal and for repetitively coupling the time delay input to receive the first and second signals in a selected sequence;
   means for coupling the time delay output to the algorithmic means input; and
   comparator means coupled to the time delay for producing a digital output signal.

8. An analog to digital converter as in claim 7 wherein comparator means comprise:
   a comparator having a first input coupled to the time delay, a reference input and an output; and
   means coupled to the comparator reference input for adjusting the potential of the reference input.

9. An analog to digital converter as in claim 8 wherein means for adjusting the potential at the reference input comprise:
   a digital storage;

a digital multiplexer coupled to receive the comparator output and to the digital storage for applying the comparator output to the digital storage in response to the analog switch coupling the time delay to receive the ground potential; and voltage adjusting means connected to the comparator reference input and to the digital storage for adjusting the potential at the reference input.

10. An analog to digital converter as in claim 9 wherein voltage adjusting means comprise:

a capacitor connected to the reference input;

current means coupled to the capacitor and to the digital storage for adjusting the voltage across the capacitor.

11. An analog to digital converter as in claim 7 wherein algorithmic means comprises a transformer having;

a primary winding coupled to receive an input;

an auxiliary secondary winding for producing the second signal; and a center tapped secondary winding having positive and negative ends for producing the first signal and a center tap for receiving a reference voltage.

12. An analog to digital converter as in claim 11 wherein the auxiliary secondary winding has a transformation ratio of −1.

13. An analog to digital converter as in claim 11 wherein the center tapped secondary has a transformation ratio of 4.

14. An analog to digital converter as in claim 7 wherein means for coupling comprise an amplifier; and a first capacitor, a second capacitor, and a third capacitor, each capacitor having one terminal commonly coupled to the amplifier.

15. An analog to digital converter as in claim 14 wherein algorithmic means comprise:

first means for coupling to a negative reference voltage;

second means for coupling to a positive reference voltage;

a first resistor coupled between the first capacitor and the first means;

a second resistor coupled between the second capacitor and the second means;

a third resistor coupled between the third capacitor and ground and having a tap for producing the first signal; and means for coupling to the connection between the first capacitor and the first resistor and to the connection between the second capacitor and second resistor for producing the second signal.

16. An analog to digital converter as in claim 8 wherein the selected sequence comprises:

the analog switch first coupling an applied analog signal to the time delay input;

next repetitively coupling the time delay input a plurality of times to receive the first and second signals in a sequence and then coupling the ground potential to the time delay input.

17. An analog to digital converter as in claim 8 wherein the selected sequence comprises:

the analog switch first coupling the time delay input to the ground potential and then repetitively coupling the time delay input a plurality of times to receive the first and second signals in a sequence.

18. An analog to digital converter comprising:

a time delay having an input and an output;

algorithmic means having an input for generating a first and second signal, the first signal being an inverse of a signal appearing at the time delay input and the second signal being a selected function of the time delay input signal corresponding to a desired conversion of an applied analog signal;

clock means for producing a first clock signal and a second clock signal, the second clock signal having a repetition rate which is a multiple of the repetition rate of the first clock signal;

switch means for coupling the time delay input to receive an applied analog signal and for repetitively coupling the time delay input to receive the first and second signals in response to the first clock signal;

means for coupling the time delay output to the algorithmic means input;

a comparator responsive to the second clock signal and having an input coupled to the time delay for producing a digital output signal.

19. An analog to digital converter as in claim 18 wherein the second clock signal has a repetition rate twice that of the first clock signal.

20. An analog to digital converter comprising:

a time delay having an input and an output;

algorithmic means having an input for generating a first, second and third signal, the first signal being an inverse of a signal appearing at the time delay input, the second signal being a selected function corresponding to a desired conversion of an applied analog signal;

a time delay;

switch means for coupling the time delay to receive an applied analog signal and to receive a ground potential in a first selected sequence and for repetitively coupling the time delay input to receive the first, second, and third signals in a second selected sequence;

means for coupling the time delay to the algorithmic means;

a comparator coupled to the time delay for producing a digital output signal havng logic levels;

a gain control having variable gain;

means for serially coupling in a loop that analog switch, the time delay, the gain control, the means for coupling and the algorithmic means; and means coupled to the gain control for varying the gain of the gain control in response to variations of the third signal.

21. An analog to digital converter as in claim 20 wherein means for varying the gain comprise:

a digital storage for storing the logic levels;

a digital multiplexer coupled to receive the digital output signal for applying the digital output signal to the digital storage in response to the switch means coupling the third signal potential to the time delay; and means coupled to the digital storage for varying the gain of the gain control in response to the logic levels stored in the digital storage.

22. An analog to digital converter comprising:

a time delay having an input and an output;

algorithmic means having an input for generating a first signal, a second signal and a third signal, the first signal being an inverse of a signal appearing at the time delay input, the second and third signals being second and third selected functions respectively of the time delay input signal corresponding to a desired conversion of an applied analog signal;

switch means for coupling the time delay input to receive the applied analog signal and for coupling in a selected sequence the time delay input to receive the first, second and third signals;

means for coupling the time delay output to the algorithmic means input; and comparator means coupled to the time delay for producing a digital output signal.

23. An analog to digital converter as in claim 22 wherein means for coupling comprise a capacitor.

24. An analog to digital converter as in claim 23 wherein algorithmic means comprise a transformer having:
a primary winding coupled to receive an input;
a first secondary winding for producing the first signal;
a second secondary winding for producing the second signal; and
a third secondary winding for producing the third signal.

25. An analog to digital converter as in claim 24 wherein the second scondary winding is center tapped for receiving a first reference voltage.

26. An analog to digital converter as in claim 24 comprising means coupled to the third secondary winding for applying a second signal thereto.

27. An analog to digital converter as in claim 26 wherein the desired conversion is a digital code representing the value $$A^m V_0 + \sum_{i=0}^{i=m-1} A^i V_{xi}$$

$V_{xi}$ being the voltage of the second signal when the switch means couples the time delay input to receive the third signal, $-A$ being the transformaton ratio of the third secondary winding to the primary winding, $V_0$ being the sampled voltage of an applied analog signal to be converted and $m$ being the number of times the switch means couples the time delay input to receive the third signal.

* * * * *

UNITED STATES PATENT AND TRADEMARK OFFICE
CERTIFICATE OF CORRECTION

PATENT NO. : 3,971,015
DATED : July 20, 1976
INVENTOR(S) : Thomas Hornak

It is certified that error appears in the above-identified patent and that said Letters Patent are hereby corrected as shown below:

Column 5, line 62, "Buffer 605" should read --Buffer 650--;

Column 6, line 63, "coder 40." should read --coder 400.--;

Column 10, line 32, "a time delay;" has been cancelled;
line 42, "havng" should read --having--;
line 44, "loop that" should read --loop the--.

Signed and Sealed this

Fifth Day of October 1976

[SEAL]

Attest:

RUTH C. MASON
*Attesting Officer*

C. MARSHALL DANN
*Commissioner of Patents and Trademarks*